United States Patent
Nobunaga et al.

(10) Patent No.: US 6,304,510 B1
(45) Date of Patent: Oct. 16, 2001

(54) MEMORY DEVICE ADDRESS DECODING

(75) Inventors: Dean Nobunaga, Sunnyvale; Frankie F. Roohparvar, Milpitas, both of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,617

(22) Filed: Aug. 31, 2000

(51) Int. Cl.[7] .................................................... G11C 7/00
(52) U.S. Cl. .............................. 365/230.06; 365/189.05; 365/230.08
(58) Field of Search ............................... 365/202, 230.06, 365/230.01, 189.05, 230.03, 230.08, 226

(56) References Cited

U.S. PATENT DOCUMENTS

| | | |
|---|---|---|
| 4,794,565 | * 12/1988 | Wu et al. ........................ 365/189.01 |
| 5,041,886 | 8/1991 | Lee . |
| 5,537,354 | 7/1996 | Mochizuki et al. . |
| 5,600,605 | 2/1997 | Schaefer . |
| 5,666,321 | 9/1997 | Schaefer . |
| 5,751,039 | 5/1998 | Kauffman et al. . |
| 5,787,457 | 7/1998 | Miller et al. . |
| 5,936,903 | 8/1999 | Jeng et al. . |
| 5,995,438 | 11/1999 | Jeng et al. . |
| 6,026,465 | 2/2000 | Mills et al. . |
| 6,111,814 | 8/2000 | Schaefer . |
| 6,137,133 | 10/2000 | Kauffman et al. . |
| 6,141,247 | 10/2000 | Roohparvar et al. . |

OTHER PUBLICATIONS

Keeth, et al., "DRAM circuit design: a tutorial," IEEE Press, 2001, pp. 16–23, 142–153.

Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.

Micron, "16 Mb:x16 SDRAM" *Synchronous DRAM*, www.micron.com, copyright 1999 Micron Technology, Inc., pp. 1–51.

* cited by examiner

*Primary Examiner*—Terrell W. Fears
(74) *Attorney, Agent, or Firm*—Fogg, Slifer & Polglaze, P.A.; Russell D. Slifer

(57) ABSTRACT

A memory device provides a more efficient address decoding operation. In one embodiment, the memory device is a synchronous flash memory that has an array of memory cells arranged in rows and columns. An external device, such as a processor, provides row and column addresses for accessing the memory array. The memory device can include the internal address counter, such as a burst counter. The address processing circuitry includes address input buffers having a first latch circuit coupled thereto, and a multiplexer coupled to receive either the input address signals or addresses generated by the internal address counter. Second latch circuits are coupled to the multiplexer circuits. The second latch circuits, in one embodiment, latch the externally provided address signals coincident with the first latch circuit. The second latch circuit is coupled to an input of a pre-decoding circuit such that time pre-decoding circuit can begin decoding the externally provided address signals during the same clock period that the address signals are received. As such, the decoding circuits can begin processing the externally provided address signals more quickly. A third latch circuit is coupled to the pre-decoding circuitry to allow the memory to latch the pre-decoder address signals during the same clock period that the address signals were received from an external source.

27 Claims, 5 Drawing Sheets

MEMORY DEVICE ADDRESS DECODING

TECHNICAL FIELD OF THE INVENTION

The present invention relates generally to memory devices and in particular the present invention relates to efficient timing of address decoding in memory devices.

BACKGROUND OF THE INVENTION

Synchronous dynamic random access memory (SDRAM) devices operate by accessing memory cells in synchronization with a clock signal. The access speed of the device is dependant upon an address decoding time, data sensing timing, and data output driving time. An increase in the clock frequency will increase the access speed requirements. A problem is experienced when the clock frequency exceeds the process speed of internal memory cell access operations. For example, to access a column of a memory array, an address signal is decoded and column select circuitry is activated. The clock speed either needs to be decreased or a more efficient use of the time between clock cycles is needed.

A problem with SDRAM is the volatile nature of the memory cells. Non-volatile memory devices such as flash memory are available, but do not operate in a synchronous manner. One problem with operating a non-volatile memory in a synchronous manner, such as an SDRAM, is the ability to efficiently use available clock cycle times to perform address decode and memory array access operations.

For the reasons stated above, and for other reasons stated below which will become apparent to those skilled in the art upon reading and understanding the present specification, there is a need in the art for an efficient address decoding system for a memory device. Further, there is a need in the art for a non-volatile memory that has a more efficient address decoding system.

SUMMARY OF THE INVENTION

The above-mentioned problems with memory addressing and other problems are addressed by the present invention and will be understood by reading and studying the following specification.

In one embodiment, a memory device comprises an address input connection to receive memory array address signals, an address input buffer coupled to the address input connection, and a first latch circuit coupled to the address input buffer to latch the memory array address signals. The memory further comprises decode circuitry to decode the memory array address signals, and a second latch circuit coupled to an input of the decode circuitry to latch the memory array address signals coincident with the first latch circuit.

A memory device in another embodiment comprises address input connection to receive memory array address signals, an address input buffer coupled to the address input connection, a first latch circuit coupled to the address input buffer to latch the memory array address signals, and an internal address counter circuit to advance the received memory array address signals. A multiplex circuit is provided that has a first input coupled to the first latch circuit and a second input coupled to the internal address counter circuit. The multiplex circuit includes an output that is coupled to a second latch circuit to latch the memory array address signals coincident with the first latch circuit. The memory includes decode circuitry to decode the memory array address signals coupled to the multiplex circuit.

In another embodiment, a synchronous non-volatile memory device comprises an array of non-volatile memory cells arranged in addressable rows and columns, address input connections to receive memory array address signals, and an address input buffer coupled to the address input connections. A first latch circuit is coupled to the address input buffer to latch the memory array address signals during a first clock period. The memory further comprises an internal address counter circuit to advance the received memory array address signals, and a multiplex circuit having a first input coupled to the first latch circuit and a second input coupled to the internal address counter circuit. The multiplex circuit includes an output that is coupled to a second latch circuit to latch the memory array address signals during the first clock cycle. A decode circuitry, to decode the memory array address signals, is coupled to the multiplex circuit.

In yet another embodiment, a method of operating a memory device comprises receiving externally provided address signals, latching the address signals in a first latch circuit prior to a first clock signal active transition, and latching the address signals in a second latch circuit prior to the first clock signal active transition. The first latch circuit is coupled to an input buffer circuit and the second latch circuit is coupled to an address decoder circuit.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
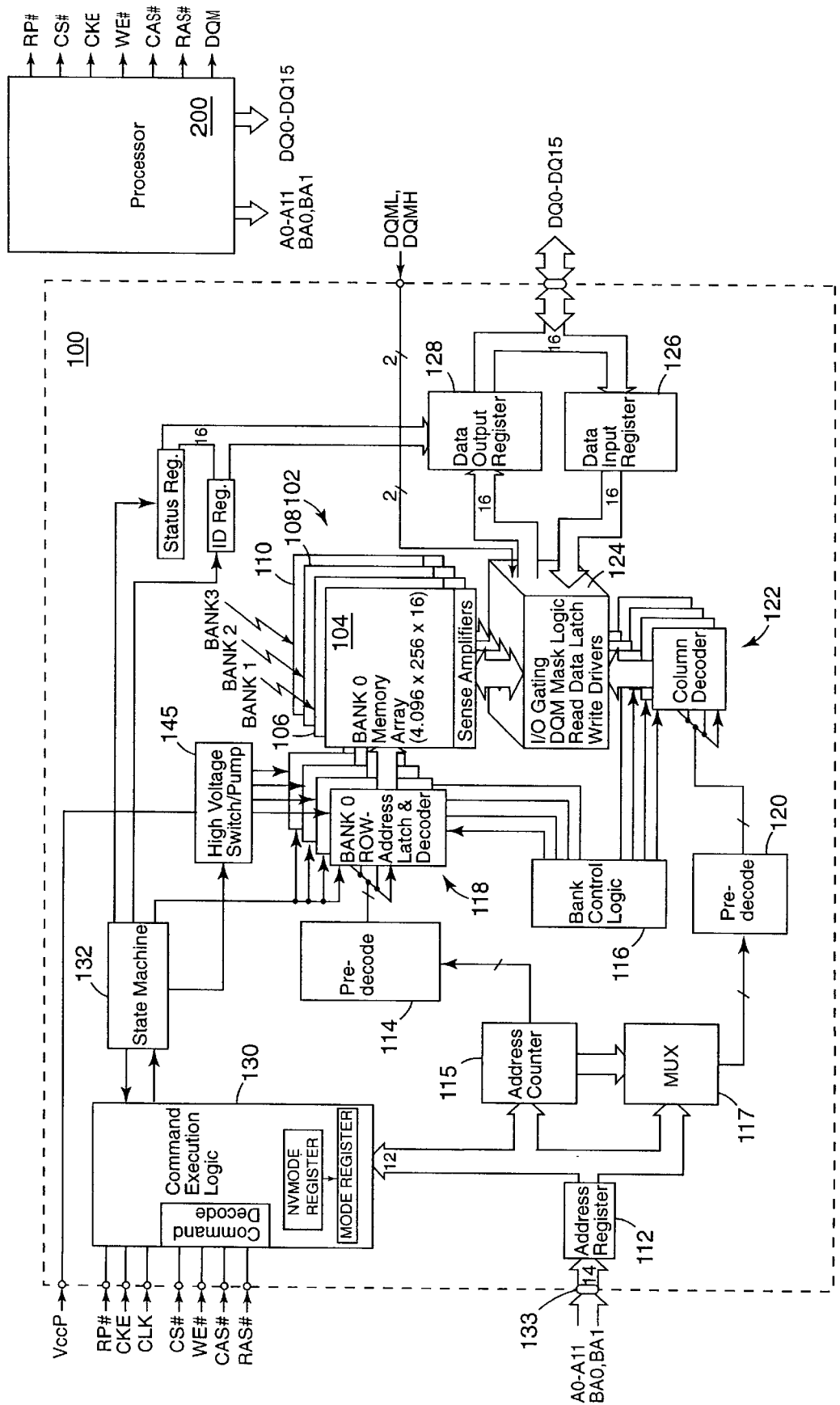
FIG. 1 is a block diagram of a synchronous memory device according to one embodiment of the present invention.

Referring to FIG. 1, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The address signals are routed through multiplex circuit 117 to row pre-decode circuitry 114 or column pre-decode circuitry 120. A row decoder 118 and column decoder 122 are provided to identify rows and columns during read and write operations. An address counter circuit 115 allows for internal advancement of address signals. Circuit 124 provides input/output gating, data mask logic, read data latch circuitry and write driver circuitry. Data is input through data input registers 126 and output through data output registers 128.

Command execution logic 130 is provided to control the basic operations of the memory device. A state machine 132 is also provided to control specific operations performed on the memory arrays and cells. A status register 134 and an identification register 136 can also be provided to output data. The command circuit 130 and/or state machine 132 can be generally referred to as control circuitry to control read, write, erase and other memory operations.

Prior to describing the operational features of the memory device, a more detailed description of the interconnect pins and their respective signals is provided. The input clock connection is used to provide a clock signal (CLK). A system clock can drive the clock signal, and all synchronous flash memory input signals are sampled on the positive edge of CLK. CLK also increments an internal burst counter and controls the output registers. The input command input connections for RAS#, CAS#, and WE# (along with CAS#, CS#) define a command that is to be executed by the memory, as described in detail below. The input/output mask (DQM) connections are used to provide input mask signals for write accesses and an output enable signal for read accesses. Input data is masked when DQM is sampled HIGH during a WRITE cycle.

Address inputs 133 are primarily used to provide address signals. In the illustrated embodiment the memory has 12 lines (A0–A11). Other signals can be provided on the address connections. The address inputs are sampled during an ACTIVE command (row-address A0–A11) and a READ/WRITE command (column-address A0–A7) to select one location in a respective memory bank. The address inputs are also used to provide an operating code during a LOAD COMMAND REGISTER operation. Address lines A0–A11 are also used to input mode settings during a LOAD MODE REGISTER operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

One embodiment of the present invention is a nonvolatile, electrically sector-erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total).

The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation.

In general, the synchronous flash memory is configured similar to a multi-bank DRAM that operates at low voltage and includes a synchronous interface. Each of the banks is organized into rows and columns The Mode Register 148 is used to define the specific mode of operation of the synchronous flash memory. This definition includes the selection of a burst length, a burst type, CAS latency, and an operating mode. The Mode Register is programmed via a LOAD MODE REGISTER command and retains stored information until it is reprogrammed. The contents of the Mode Register may be copied into the NVMode Register 147. The NVMode Register settings automatically load the Mode Register 148 during initialization. Details on ERASE NVMODE REGISTER and WRITE NVMODE REGISTER command sequences are provided below. Those skilled in the art will recognize that an SDRAM requires that a mode register must be externally loaded during each initialization operation. The present invention allows a default mode to be stored in the NV mode register 147. The contents of the NV mode register are then copied into a volatile mode register 148 for access during memory operations.

Read accesses to the synchronous flash memory can be burst oriented, with the burst length being programmable, as shown in Table 1. The burst length determines the maximum number of column locations that can be automatically accessed for a given READ command. Burst lengths of 1, 2, 4, or 8 locations are available for both sequential and the interleaved burst types, and a full-page burst is available for the sequential type. Accesses within a given burst may be programmed to be either sequential or interleaved. The burst length, the burst type and the starting column address, as shown in Table 1, determine the ordering of accesses within a burst.

TABLE 1

| | BURST DEFINITION | | |
|---|---|---|---|
| | | Order of Accesses Within a Burst | |
| Burst Length | Starting Column Address | Type = Sequential | Type = Interleaved |
| 2 | A0 0 1 | 0-1 1-0 | 0-1 1-0 |

TABLE 1-continued

BURST DEFINITION

| Burst Length | Starting Column Address | | | Order of Accesses Within a Burst | |
|---|---|---|---|---|---|
| | | | | Type = Sequential | Type = Interleaved |
| 4 | | A1 | A0 | | |
| | | 0 | 0 | 0-1-2-3 | 0-1-2-3 |
| | | 0 | 1 | 1-2-3-0 | 1-0-3-2 |
| | | 1 | 0 | 2-3-0-1 | 2-3-0-1 |
| | | 1 | 1 | 3-0-1-2 | 3-2-1-0 |
| 8 | A2 | A1 | A0 | | |
| | 0 | 0 | 0 | 0-1-2-3-4-5-6-7 | 0-1-2-3-4-5-6-7 |
| | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-0-3-2 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |
| Full Page 256 | n = A0–A7 (location 0–255) | | | Cn, Cn + 1, Cn + 2 Cn + 3, Cn + 4 ... Cn-1, Cn ... | Not supported |

Address Decoding

The present invention provides for more efficient address decoding in a memory device. Any type of memory can benefit from the present invention, including the synchronous non-volatile memory described above. As known to those skilled in the art, memory devices typically use pre-decoder and decoder circuits to decode externally provided address and access a row and column(s) of the memory. The speed of the decoding circuitry is critical to quickly accessing the memory array.

Figure 2:
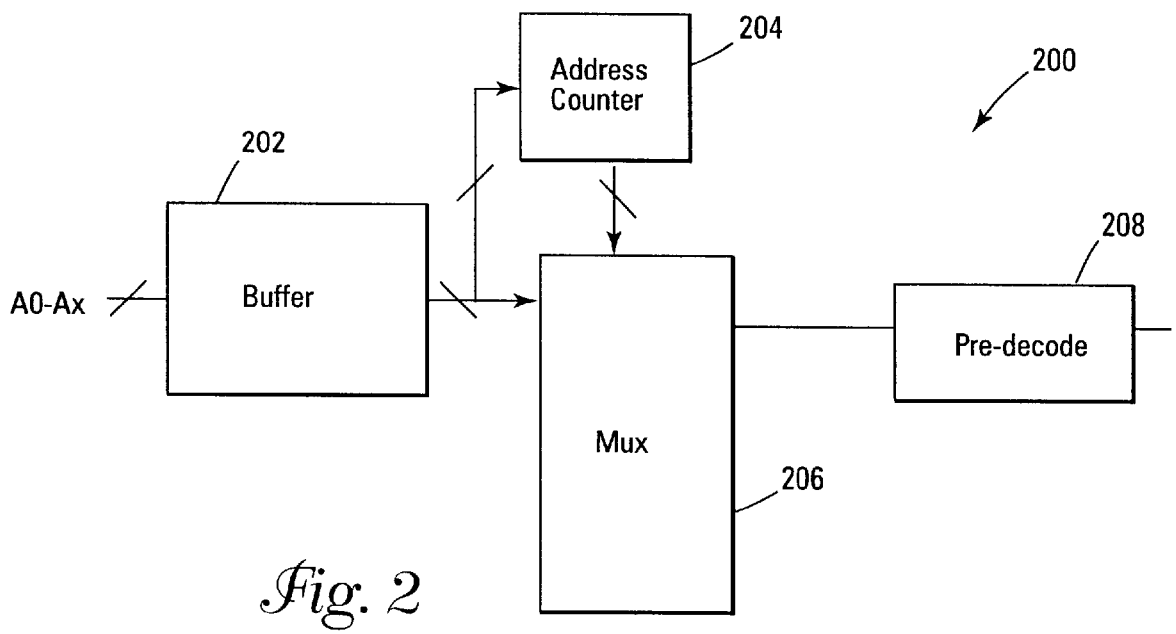
FIG. 2 illustrates a block diagram of an address processing circuit according to one embodiment of the present invention.

Referring to FIG. 2, the present invention includes an addressing system 200 that has an address input buffer circuit 202, address counter 204, multiplexer circuit 206 and an address predecoder 208. Latch circuits are included in each of the address input buffer circuit, multiplexer circuit and an address pre-decoder circuit, is explained below. In general, the present invention takes advantage of an address signal set-up time specified for memory devices. The address decoding circuitry does not wait until a subsequent rising edge of a clock signal to begin decoding address signals received on a first clock rising edge. In contrast, the address decoding of the present invention begins decoding address signals as soon as a valid address is received. As explained below, the address signals are latched in the address input buffers 202 on a rising edge of the clock signal. The address signals, however, simultaneously propagate through the address multiplex circuitry 206 and to decoder circuitry 208.

Figure 3:
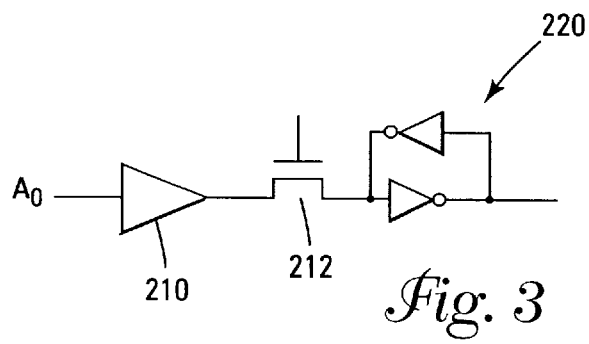
FIG. 3 is a schematic diagram of a buffer and latch circuit of the present invention.
Figure 4:
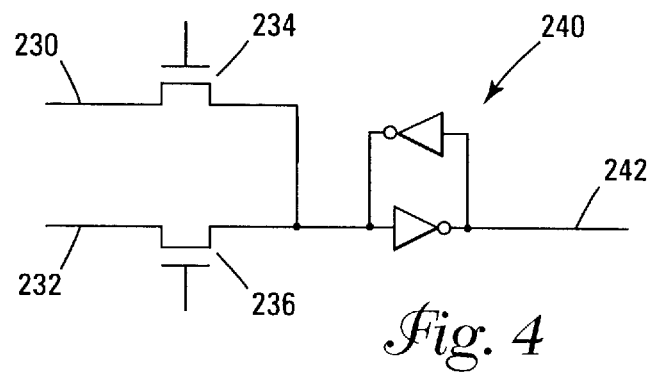
FIG. 4 is a schematic diagram on a multiplex and latch circuit of the present invention.

The buffer circuitry 202 includes separate buffers 210 and latch circuits 220 for each of the address input signals A0–Ax, see FIG. 3. The buffer 210 is selectively coupled to a latch 220 via a pass circuit 212, such as the illustrated transistor. A simplified multiplex circuit 206 is illustrated in FIG. 4. The multiplex circuit has an input 232 coupled to the input buffer and a second input 234 coupled to the address counter 204. One of the two inputs is selectively coupled to a multiplex latch circuit 240 through pass transistors 234 or 236. The output 242 of the multiplex circuit is then coupled to the pre-decoder circuitry 208.

Figure 5:
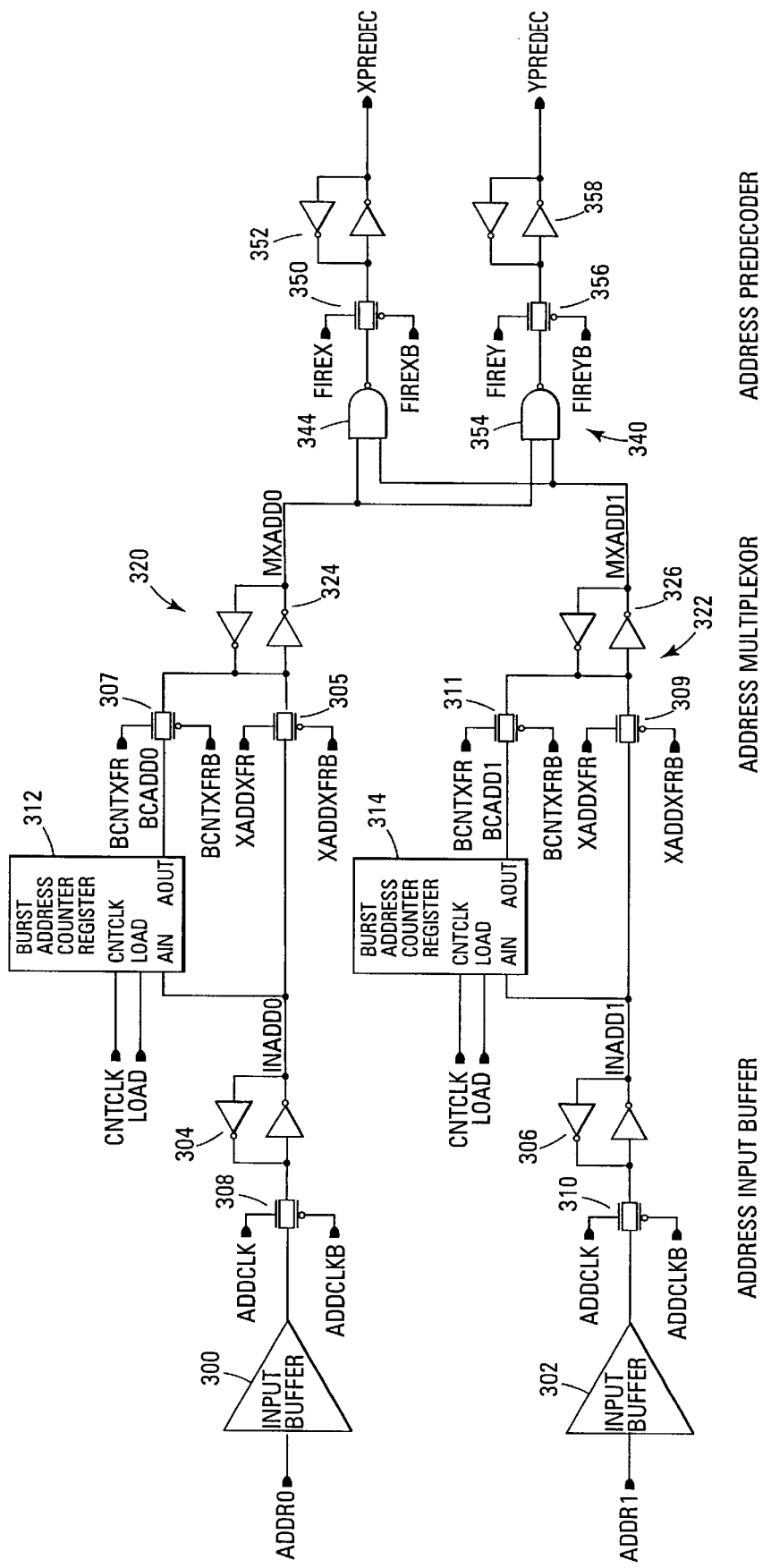
FIG. 5 is a schematic diagram of an address processing circuit according to another embodiment of the present invention.

FIG. 5 is a more detailed schematic diagram illustrating two address inputs, ADDR0 and ADDR1, and associated decode circuitry. Each address input node is coupled to input buffers 300 or 302. The buffers are coupled to first latches 304 or 306 via transfer gates 308 or 310, respectively. The first latches are coupled to an input of burst counter register 312 or 314. The burst address counter registers are used to increment one address signal and are part of the burst counter circuitry described above, with reference to FIG. 1. Each counter is coupled to a first input of a multiplexer circuit 320 or 322. The second input of the multiplexers is coupled to the first latch circuits 304 or 306. The output of the multiplexers are coupled to a second latches 324 or 326.

The illustrated address circuit has two address signals, ADDR0 and ADDR1, that are decoded during access operations. Both of the address signals have associated counter registers 312 and 314, multiplexers 320 and 322 and latches 324 and 326. Each of the multiplexers are coupled to logic circuitry 340 as a pre-decoder circuit. In this example, the logic circuitry includes a NAND gate having inputs coupled to each of the multiplexer outputs/latches. The output of the NAND gates are latched and coupled to X and Y pre-decode circuits (not shown). That is, one of the NAND gates 344 is coupled to an X pre-decode circuit via transfer gates 350 and latch 352. The other NAND 354 is coupled to a Y pre-decode circuit via transfer circuit 356 and latch 358.

Figure 6:
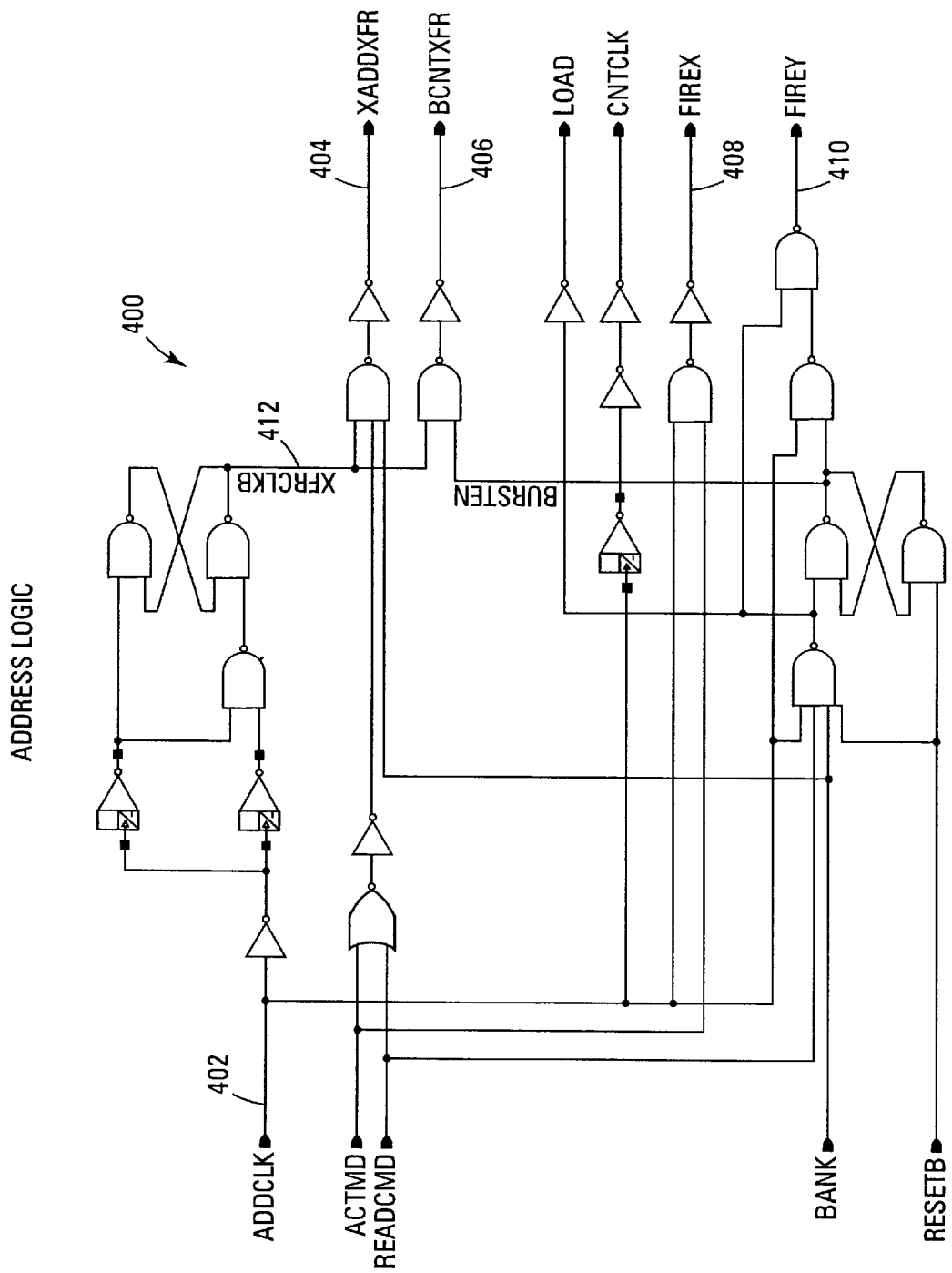
FIG. 6 is a schematic diagram of address logic to provide signals for the address processing circuit of FIG. 5.

FIG. 6 is a schematic diagram of one example of address logic circuit 400 that provides control signals for the circuitry of FIG. 5. The logic uses the clock signal 402 to generate transfer gate signals XADRXFER 404, BCNTXFR 406, FIREX 408 and FIREY 410. The circuitry uses an active command (ACTCMD), a read command (READCMD), a bank command (BANK) and a bank reset command (RESETB). In addition to the transfer gate control signals, circuit 400 provides the counter load command (LOAD) and counter clock (CNTCLK). Node 412 provides XFRCLKB that is an inverted ADDCLK signal with a different duty cycle.

Figure 7:
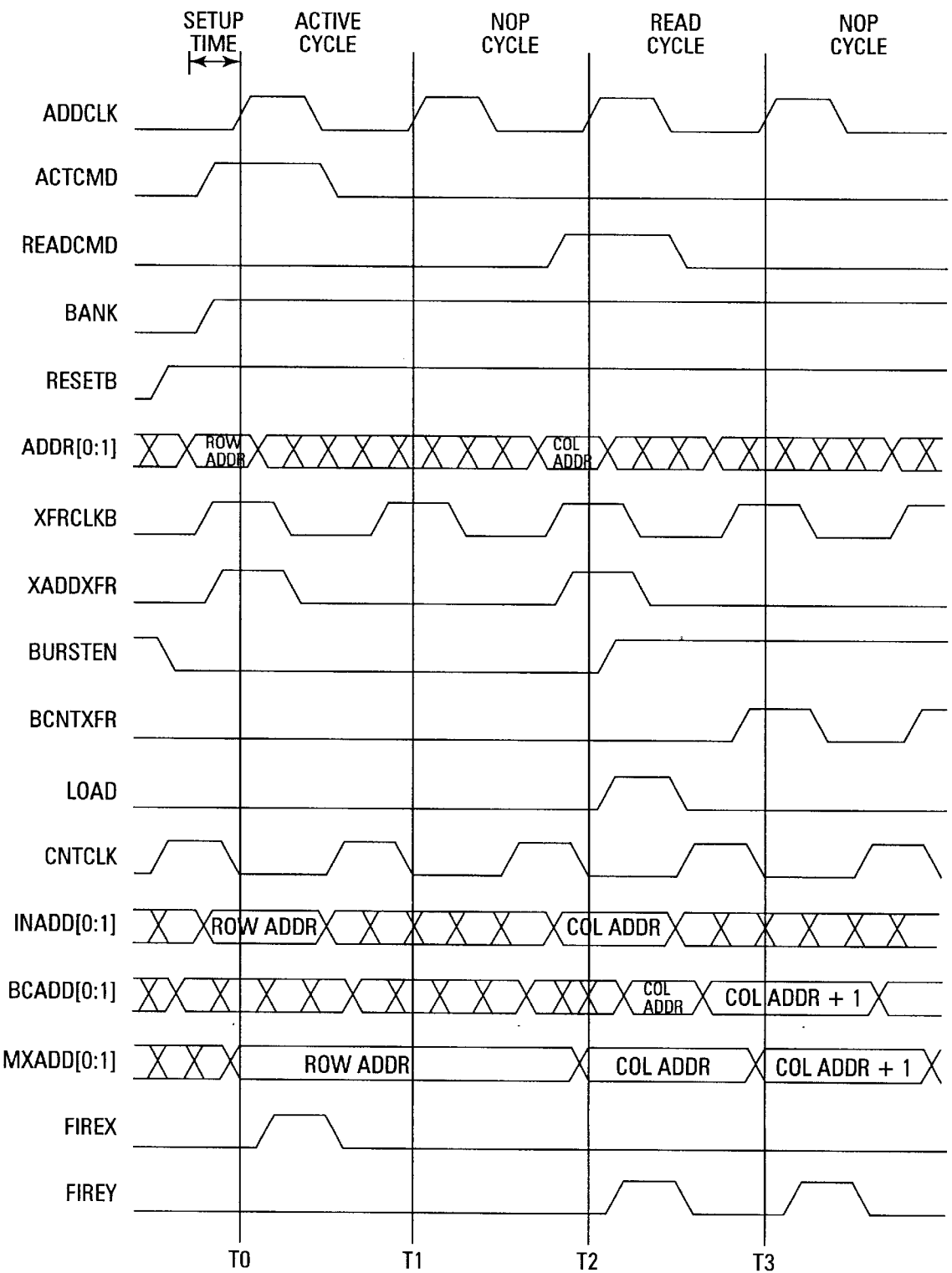
FIG. 7 is a timing diagram of the address processing circuit of FIG. 5.

FIG. 7 illustrates a timing diagram of one embodiment of the present invention. During a setup time (prior to T0) for an Active or Read cycle in the synchronous flash memory embodiment, while the ADDCLK signal is low and the XADDXFR signal is high, the address input signals ADDR0 and ADDR1 (ADDR[0:1]) propagate thru to latches 324 and 326 (signals MXADD0 and MXADD1). During the setup time, address transfer gates 308 and 305 are activated to allow the address input signals to propagate to the predecoder circuitry and be established before the rising edge of the clock signal at T0. This allows for a faster address decoding time. The predecoder input address, MXADD0 and MXADD1 is valid for the entire clock period, which insures that the wrong address signal will not be decoded. This is especially beneficial at higher clock speeds where the clock period and the clock high pulse width is reduced. As known to those skilled in the art, setup time is a specified time prior to a trigger signal, such as a clock signal, in which input signals must be at a valid state. As such, setup time in the present invention refers to a time period starting at a time prior to the clock signal when the address signals are required to be valid and the clock signal. The present invention ripples the address signals through to the pre-decoder during this setup time so that the address signals can be decoded during setup. The address signals are latched for a full clock period, starting at the beginning of the setup time. That is, the address latch time is not synchronized to the clock signal, but is a clock period in length.

Address transfer gate 308 is clocked with ADDCLK and address transfer gates 305 and 307 are clocked with XADDXFR and BCNTXFR, respectively. XADDXFR and BCNTXFR are generated from XFRCLKB. XFRCLKB is derived from ADDCLK but is inverted and can have a different duty cycle. XADDXFR is generated during the setup time of an Active or Read cycle. BCNTXFR is generated during the setup time of a burst Read cycle after the initial first Read cycle. Using XADDXFR allows address transfer gate 305 to be closed before address transfer gate 308. This prevents a new wrong address from propagating in and disrupting the current Active or Read cycle. Using XADDXFR also allows address transfer gate 305 to be opened while address transfer gate 308 is open during the setup time, and allows for a faster address decoding time. Using BCNTXFR allows address transfer gate 307 to be opened during the setup time of a burst read cycle and thus also allows for a faster decoding time. CNTCLK is used for incrementing the burst counter register, and can be generated by delaying ADDCLK.

Prior to time T1, transfer gates 350 of the address pre-decode circuitry are activated using the FIREX signal to latch the address signals at the X pre-decoder circuit using latch 352. The decoder circuitry, therefore, can begin decoding the address signals prior to the next rising edge of the address clock signal. As such, all three latches receive the address input signals during the same clock signal period.

In the synchronous flash memory described above, an active command is executed on the first address clock signal (T0) to load a row address for a memory read. No operation (NOP) is performed during the second clock cycle (T1). This open cycle is typically provided to meet with synchronous memory set-up time and decode time specifications. Following the NOP, one or more read commands (T2) are issued to load column addresses.

Immediately prior to time T2, a valid column address is provided on ADDR[0:1] and latched by the address buffer latches 304 and 306. While the ADDCLK signal is low and the XADDXFR signal is high, the address input signals ADDR0 and ADDR1 (ADDR[0:1]) propagate thru to latches 324 and 326 (signals MXADD0 and MXADD1).

Prior to time T3, the Y transfer gates 356 of the address pre-decode circuitry are activated using the FIREY signal to latch the address signals at the Y pre-decoder circuit latch 358. The decoder circuitry, therefore, can begin decoding the address signals prior to the next rising edge of the address clock signal. Also prior to time T3, the counter circuitry 312 and 314 are loaded with the column addresses in response to the active transition of the LOAD signal. After the counters have been loaded, the counter clock signal (CNTCLK) increments the counter address prior to T3 and the first input of the multiplex circuit is coupled to its output via transfer gates 307 and 311 in response the BCNTXFR signal at time T3. Thus, the internal counter circuit generates additional column addresses following an externally provided column address. After latches 324 and 326 latch the multiplex circuit output, the Y pre-decoder pass circuitry 350 and 356 are activated by FIREY to latch the new column address prior to a subsequent address clock high transition (not shown).

The above described address circuitry illustrates some embodiments of the present invention and is not intended to be limiting. Additional embodiments are contemplated, and one skilled in the art with the benefit of the present will appreciate that the above embodiments can be modified without departing from the present invention. The present invention takes advantage of address signal set-up times to begin decoding. The address signals are latched in address input buffers on a rising edge of the clock signal. The address signals simultaneously propagate through the address multiplex circuitry and to address decoder circuitry. Thus, the present invention provides latches at the input of the pre-decoder circuitry that can latch input addresses during the same clock cycle that the address signals are received.

Conclusion

A memory device has been described herein that provides a more efficient address decoding operation. In one embodiment, the memory device is a synchronous flash memory that has an array of memory cells arranged in rows and columns. An external device, such as a processor, provides row and column addresses for accessing the memory array. The memory device can include the internal address counter, such as a burst counter. The address decoding circuitry includes address input buffers having a first latch circuit coupled thereto, and a multiplexer coupled to receive either the input address signals or addresses generated by the internal address counter. Second latch circuits are coupled to the multiplexer circuits. The second latch circuits, in one embodiment, latch the externally provided address signals coincident with the first latch circuit. The second latch circuit is coupled to an input of a pre-decoding circuit such that pre-decoding circuit can begin decoding the externally provided address signals during the same clock period that the address signals are received. As such, the decoding circuits can begin processing the externally provided address signals more quickly. A third latch circuit is coupled to the pre-decoding circuitry to allow the memory to latch the pre-decoder address signals during the same clock period that the address signals were received from an external source. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   an address input connection to receive memory array address signals;
   an address input buffer coupled to the address input connection;
   a first latch circuit coupled to the address input buffer to latch the memory array address signals;
   decode circuitry to decode the memory array address signals; and
   a second latch circuit coupled to an input of the decode circuitry to latch the memory array address signals coincident with the first latch circuit.

2. The memory device of claim 1 further comprising:
   an internal address counter circuit to advance the received memory array address signals; and
   a multiplex circuit selectively couplable to the second latch circuit.

3. The memory device of claim 1 wherein the decode circuitry comprises a third latch circuit.

4. The memory device of claim 3 wherein the memory device is a synchronous memory and first, second and third latch circuits latch the memory array address signals during a common clock signal period.

5. A memory device comprising:
   address input connection to receive memory array address signals;

an address input buffer coupled to the address input connection;

a first latch circuit coupled to the address input buffer to latch the memory array address signals;

an internal address counter circuit to advance the received memory array address signals;

a multiplex circuit having a first input coupled to the first latch circuit and a second input coupled to the internal address counter circuit, the multiplex circuit includes an output that is coupled to a second latch circuit to latch the memory array address signals coincident with the first latch circuit; and decode circuitry to decode the memory array address signals coupled to the multiplex circuit.

6. The memory device of claim 5 wherein the decode circuitry comprises:

pre-decoder logic; and a third latch circuit coupled to the pre-decoder logic.

7. The memory device of claim 6 wherein the memory device is a synchronous memory and first, second and third latch circuits latch the memory array address signals during a common clock signal period.

8. A synchronous non-volatile memory device comprising:

an array of non-volatile memory cells arranged in addressable rows and columns;

address input connections to receive memory array address signals;

an address input buffer coupled to the address input connections;

first latch circuit coupled to the address input buffer to latch the memory array address signals during a first clock cycle;

an internal address counter circuit to advance the received memory array address signals;

a multiplex circuit having a first input coupled to the first latch circuit and a second input coupled to the internal address counter circuit, the multiplex circuit includes an output that is coupled to a second latch circuit to latch the memory array address signals during the first clock cycle; and decode circuitry to decode the memory array address signals coupled to the multiplex circuit.

9. The synchronous non-volatile memory device of claim 8 wherein the decode circuitry comprises:

pre-decoder logic; and a third latch circuit coupled to the pre-decoder logic.

10. The synchronous non-volatile memory device of claim 9 wherein the memory device is a synchronous memory and first, second and third latch circuits latch the memory array address signals during a common clock signal period.

11. The synchronous non-volatile memory device of claim 8 wherein the decode circuitry comprises:

an x-decoder to decode row addresses of the memory array address signals; and a y-decoder to decode column addresses of the memory array address signals.

12. A memory system comprising:

a processor; and a memory device coupled to the processor, the memory device comprises, address input connection to receive memory array address signals from the processor, an address input buffer coupled to the address input connection, a first latch circuit coupled to the address input buffer to latch the memory array address signals, an internal address counter circuit to advance the received memory array address signals, a multiplex circuit having a first input coupled to the first latch circuit and a second input coupled to the internal address counter circuit, the multiplex circuit includes an output that is coupled to a second latch circuit to latch the memory array address signals coincident with the first latch circuit, and decode circuitry to decode the memory array address signals coupled to the multiplex circuit.

13. The memory system of claim 12 wherein the decode circuitry comprises: an x-decoder to decode row addresses of the memory array address signals; and a y-decoder to decode column addresses of the memory array address signals.

14. A synchronous memory device comprising:

address inputs to receive externally provided address signals;

decode circuitry to decode the externally provided address signals; and latch circuitry coupled to the address inputs and the decode circuitry to latch and couple the externally provided address signals to the decode circuitry during one clock signal period.

15. The synchronous memory device of claim 14 further comprising;

an address input buffer coupled to the address input connection; and an internal address counter circuit to advance the received memory array address signals.

16. The synchronous memory device of claim 15 wherein the latch circuitry comprises:

a first latch circuit coupled to the address input buffer to latch the memory array address signals; and a second latch circuit coupled to the decode circuitry to latch the memory array address signals coincident with the first latch circuit.

17. A method of operating a memory device comprising:

receiving externally provided address signals;

latching the address signals in a first latch circuit during a first clock signal inactive state;

latching the address signals in a second latch circuit during the first clock signal inactive state, wherein the first latch circuit is coupled to an input buffer circuit and the second latch circuit is coupled to an address decoder circuit.

18. The method of claim 17 further comprising latching the decoded address signals provided by the address decoder circuit prior to a second subsequent clock signal active transition.

19. The method of claim 17 wherein the memory device comprises a multiplexer coupled to the second latch circuit to selectively latch either the externally provided address signals or internally generated address signals.

20. A method of operating an address decoding circuit of a memory device comprising:

receiving row address signals prior to a first active transition of a clock signal;

latching the row address signals in first and second latch circuits prior to the first active transition of the clock signal, wherein the first latch circuit is coupled to an input address buffer and the second latch circuit is coupled to an input of an address decoding circuit; and performing a pre-decoder operation on the row address signals and latching the pre-decoded row address signals in a third latch circuit prior to a subsequent second active transition of the clock signal.

21. The method of claim 20 further comprising:

receiving column address signals on a subsequent third active transition of the clock signal;

latching the column address signals in the first and second latch circuits prior to a third active transition of the clock signal;

performing a pre-decoder operation on the column address signals; and latching the pre-decoded column address signals in the third latch circuit prior to a subsequent fourth active transition of the clock signal.

22. The method of claim 21 further comprising:

incrementing an internal address counter circuit to generate second column address signals; and latching the second column address signals in the second latch circuit prior to the fourth active transition of the clock signal.

23. A method of operating a memory system comprising:

providing address signals from a processor to a memory device prior to a setup time before a first clock signal transition;

latching the address signals in the memory device during the setup time; and performing a pre-decode operation on the address signals during the setup time.

24. The method of claim 23 wherein latching the address signals comprises:

latching the address signals in a first latch circuit coupled to address input buffer circuits; and latching the address signals in a second latch circuit coupled to pre-decoder circuitry.

25. The method of claim 24 wherein the address signals are latched in the second latch circuit for a time equal to one clock signal period.

26. The method of claim 23 further comprising latching the pre-decoded address signals in a third latch circuit during the first clock signal cycle.

27. The method of claim 23 wherein the memory device is a synchronous flash memory device.

* * * * *